(12) United States Patent
Haight et al.

(10) Patent No.: US 6,591,154 B2
(45) Date of Patent: Jul. 8, 2003

(54) SYSTEM AND METHOD FOR MODIFYING ENCLOSED AREAS FOR ION BEAM AND LASER BEAM BIAS EFFECTS

(75) Inventors: Richard A. Haight, Mahopac, NY (US); Peter P. Longo, Hopewell Junction, NY (US); Alfred Wagner, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 09/737,398

(22) Filed: Dec. 15, 2000

(65) Prior Publication Data

US 2003/0105547 A1 Jun. 5, 2003

(51) Int. Cl.[7] .................................................. H04N 1/21
(52) U.S. Cl. .............................. 700/110; 438/4; 438/12; 438/14
(58) Field of Search ............................. 700/110; 438/4, 438/12, 14; 345/204, 698

(56) References Cited

U.S. PATENT DOCUMENTS

| 5,027,132 | A | * | 6/1991 | Manns et al. ................ 347/225 |
| 6,103,539 | A | * | 8/2000 | Schaffer et al. ................ 438/4 |
| 6,205,239 | B1 | * | 3/2001 | Lin et al. ..................... 382/149 |
| 6,228,542 | B1 | * | 5/2001 | Kamon ........................... 430/5 |

OTHER PUBLICATIONS http://www.xanalys.com/software_tools/reference/lwl41/climuser/GUIDE_38.HTM.*

* cited by examiner

*Primary Examiner*—Leo Picard
*Assistant Examiner*—Michael D Masinick
(74) *Attorney, Agent, or Firm*—Scully, Scott, Murphy & Presser; Daniel P. Morris, Esq.

(57) ABSTRACT

A system and method for repairing defects in semiconductor wafers utilizing a repair tool including a device for applying energy to obliterate defects at locations on the wafer, the method being a graphical approach implementing a graphical user interface (GUI) comprising a pixel screen display and comprising the steps of: via the interface, identifying a wafer defect to repair and enclosing the defect within a polygonal repair outline drawn using a default line thickness; graphically adjusting the line thickness to modify the enclosed polygonal repair outline area; automatically detecting one or more areas within an interior region of the modified polygonal repair outline area; and, scanning the modified polygonal repair outline, and for each pixel location inside the one or more detected areas, applying energy to the wafer coordinated to the pixel location for repairing the defect, whereby the identification of said pixel location is accomplished using standard graphical tools with minimal operator intervention.

21 Claims, 4 Drawing Sheets

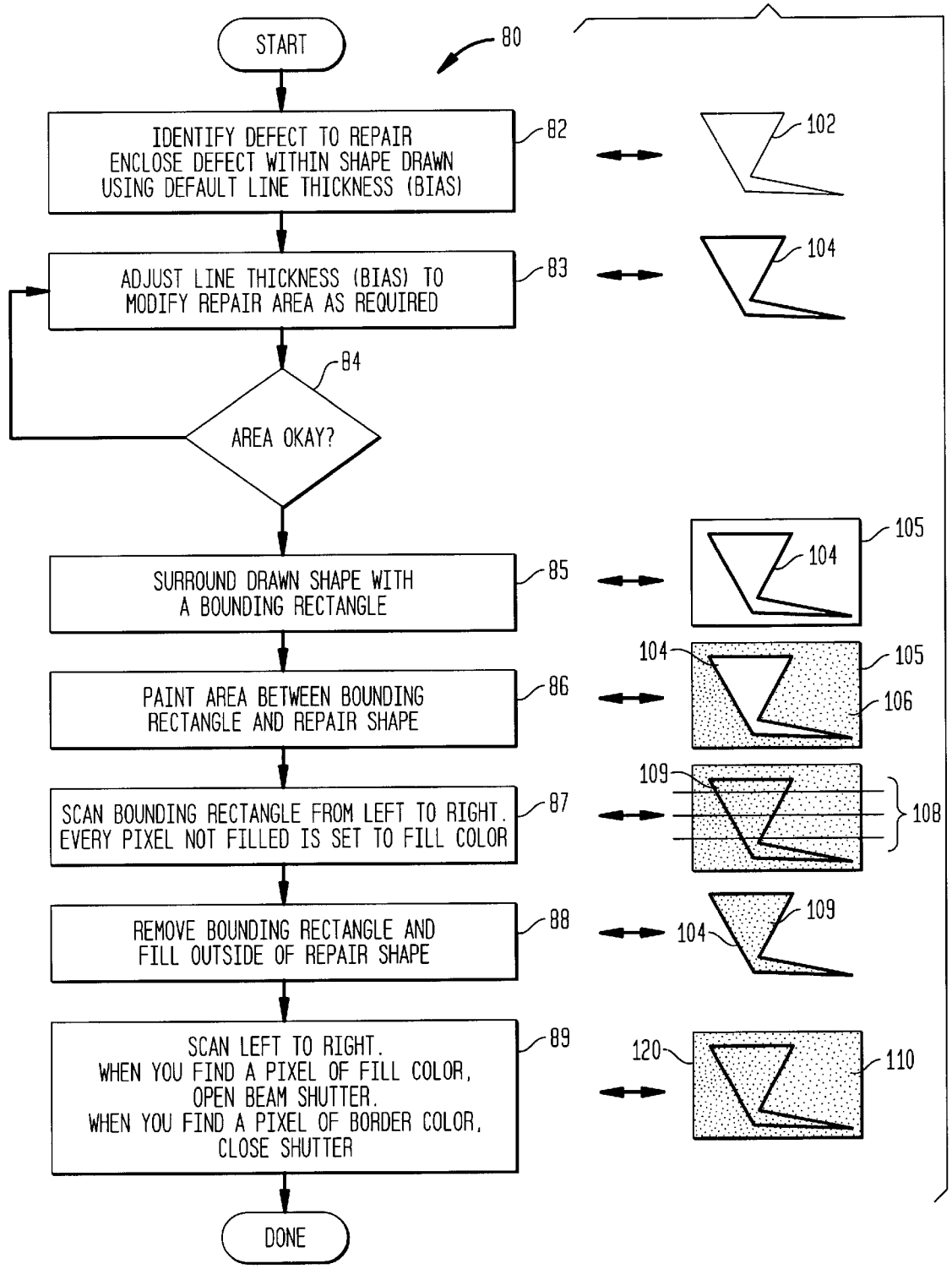

SYSTEM AND METHOD FOR MODIFYING ENCLOSED AREAS FOR ION BEAM AND LASER BEAM BIAS EFFECTS

BACKGROUND OF THE INVENTION

1. Field of the Invention

This invention relates generally to laser and focused ion beam tools for repairing semiconductor-wafers, and particularly, an enhanced software technique for modifying operator indicated repair areas based on laser and focused ion beam effects.

2. Discussion of the Prior Art

In laser and focused ion beam repair tools, an operator views an image (in real time on a computer) of a semiconductor wafer/mask that may have some defects on it, e.g., material that must be removed from the wafer/mask to make it functional. When the operator locates a defect, he uses the computer-based control system to draw an outline around the defect that needs to be removed. The computer software then translates the screen coordinates into real world coordinates and either moves the laser/ion beam or the stage on which the wafer/mask sits, in order to have the laser/ion beam impinge on the defect within the area outlined by the operator.

When a tool operator draws enclosed shapes that indicate an area to be ablated of material by either a laser or ion beam, the size of the beam must be taken into account when the beam actually scans the area. FIG. 1(a) depicts a polygonal line segment 15 representing an outline of an area 20 that an operator wishes to repair. The circles 22 represent the diameters of the beam which are of the order of less than ½ a micron in diameter. As known, the laser beam, modulated by an optical shutter such as a Pockels cell, is scanned across the actual wafer/mask 10, for example, in a horizontal direction to do the repair. Particularly, the optical shutter is closed during scanning outside of the outlined segment 15, and is opened when scanning beam is within the desired area 20. As shown in FIG. 1(a) some of the outlined segment edges, e.g., edge 16, intersects with the laser beam circles, e.g., circle 22a, and the operator must make a decision as to whether to open or keep the shutter closed. To illustrate the bias effect, FIG. 1(b) is a graphical representation of a repair outline 15 of area 20 as in FIG. 1(a) when implementing a laser beam tool generating beams of increased beam size, i.e., a Pockels cell shutter forming laser/ion beam having a circle diameter 23. FIG. 1(b) thus illustrates the basis for applying bias effects to a repair according to the prior art, which is to change the beam circle radius. Application of this bias technique requires numerous calculations against intersections with the line segments, and are subject to rounding errors, spot misplacements, and failure when a piece of the shape to be repaired is removed after applying bias.

Other techniques for applying bias relied on moving the line segments that form the polygon computationally. This leads to a non-deterministic situation since some operator drawn shapes would cause these methods to fail. That is, the situation is non-deterministic because there are no restraints on what kind of shapes the operator might draw, nor on what the bias at any particular application might be. The typical failure mode occurs when vertices and line segments need to be removed as a result of applying bias corrections.

It would be highly desirable to provide a laser/ion beam bias technique that is operator-friendly, simple to implement, and results in accurate repairs of wafer/mask defects.

SUMMARY OF THE INVENTION

It is an object of the present invention to provide a graphical technique for modifying an enclosed area for ion beam and laser beam bias effects that is speedier and more accurate than prior art techniques which are largely computational.

It is another object of the present invention to provide a graphical technique for modifying an enclosed area for ion beam and laser beam bias effects using standard graphical tools available in most programming languages.

According to the invention, there is provided a system and method for repairing defects in semiconductor wafers utilizing a repair tool including a device for applying energy to obliterate defects at locations on the wafer, the method being a graphical approach implementing a graphical user interface (GUI) comprising a pixel screen display and comprising the steps of: via the interface, identifying a wafer defect to repair and enclosing the defect within a polygonal repair outline drawn using a default line thickness; graphically adjusting the line thickness to modify the enclosed polygonal repair outline area; automatically detecting one or more areas within an interior region of the modified polygonal repair outline area; and, scanning the modified polygonal repair outline, and for each pixel location inside the one or more detected areas, applying energy to the wafer coordinated to the pixel location for repairing the defect, whereby the identification of said pixel location is accomplished using standard graphical tools with minimal operator intervention.

Advantageously, such a system and method of the invention is applicable in a manufacturing environment. Standard graphical tools are used as opposed to large amounts of custom software. Accordingly, computational complexity of repair operations and errors due to round offs with floating point numbers are eliminated. Moreover, due to the largely automatic process, operator error is minimized. As a result, the speed and accuracy with which repairs defects are performed is significantly enhanced.

BRIEF DESCRIPTION OF THE DRAWINGS

Further features, aspects and advantages of the apparatus and methods of the present invention will become better understood with regard to the following description, appended claims, and the accompanying drawing where:

FIG. 3(a) shows a repair outline 30 as outlined by an operator while

FIG. 4(a) again illustrates an example repair 40 as outlined by an operator while

FIG. 6(a) depicts the software driven methodology 80 for laser/ion beam bias technique for applying repairs to semiconductor wafers according to the invention while FIG. 6(b) graphically depicts the represented method steps involved.

DETAILED DESCRIPTION OF THE PREFERRED EMBODIMENTS

Figure 1A:
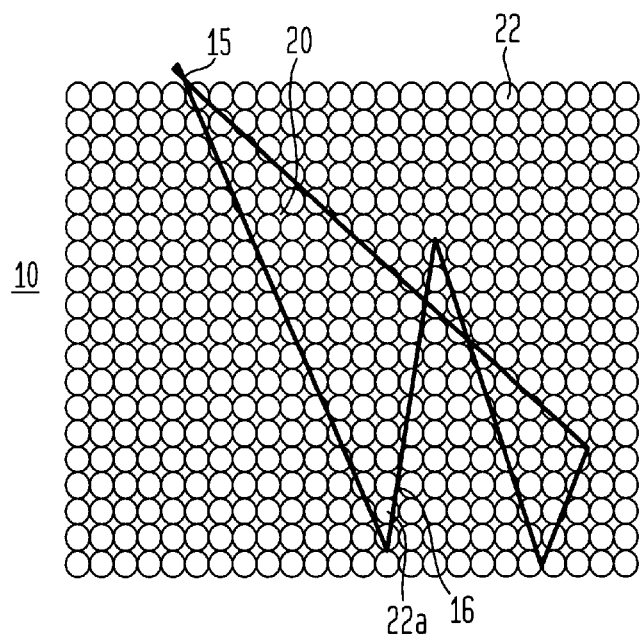
FIG. 1(a) is an illustration depicting common laser/ion beam scanning technique for applying repairs to semiconductor wafers.
Figure 1B:
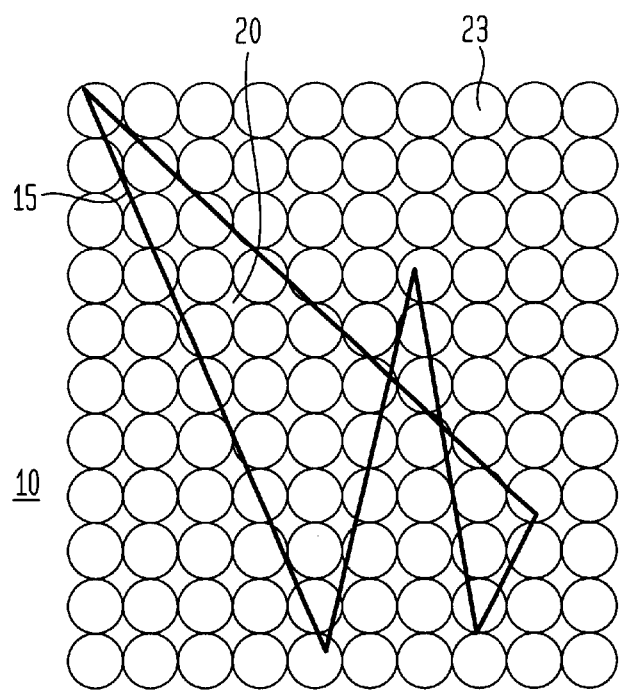
FIG. 1(b) depicts an application of a laser/ion beam biasing effect for applying repairs to semiconductor wafers according to the prior art.
Figure 2:
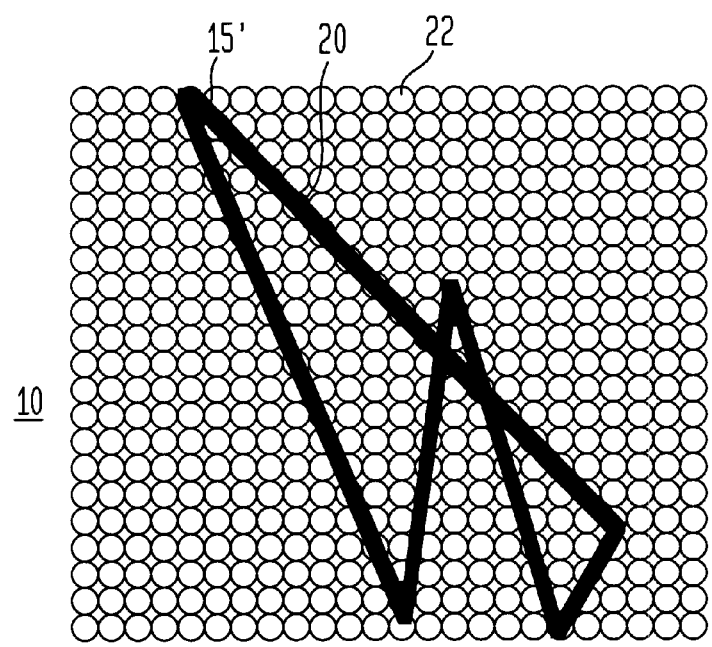
FIG. 2 is an illustration depicting laser/ion beam scanning technique for applying repairs to semiconductor wafers.

FIG. 2 illustrates a new software driven laser/ion beam bias technique for applying repairs to semiconductor wafers. According to the technique of the invention, a graphical technique is implemented for applying bias by increasing the line segment thickness 15'. By increasing the line segment thickness (via standard graphics commands available in most programming languages) the same bias effect can be gained by performing all of the calculations required in accordance with the bias technique depicted in FIG. 1(*b*), albeit much simpler, faster, and without error.

Figure 3A:
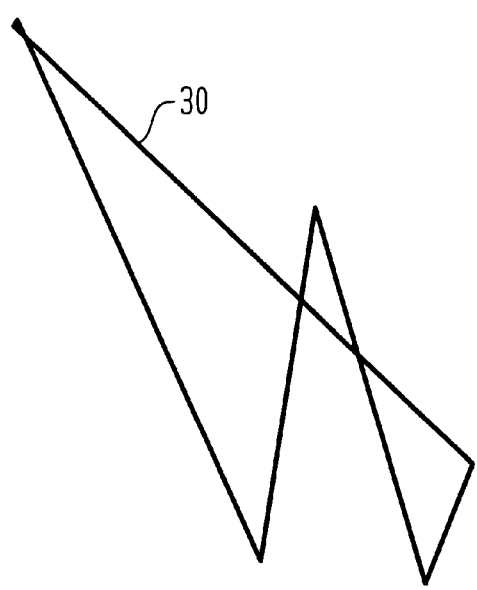
Figure 3B:
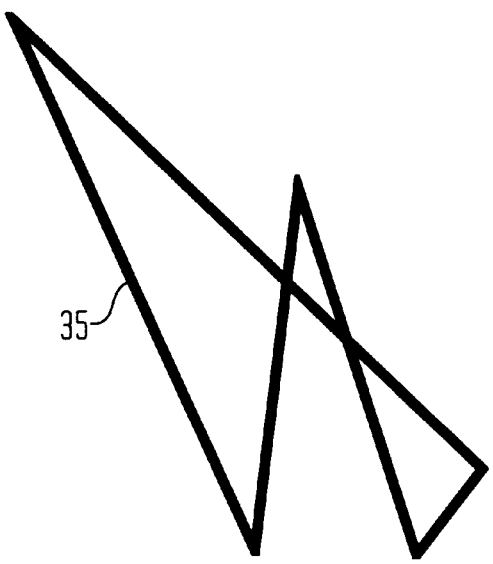
FIG. 3(b) illustrates the same repair outline 35 with bias correction applied according to the invention.

FIG. 3(*a*) shows an example repair outline 30 as outlined by an operator while FIG. 3(*b*) illustrates the same repair outline 35 with bias correction applied according to the invention. According to the invention, the operator may select a different bias and the application software draws the same shape but with line segments of different thickness.

Figure 4A:
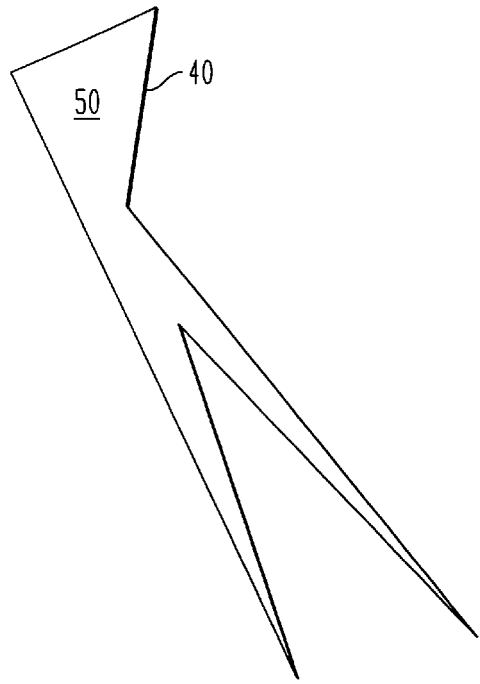
Figure 4B:
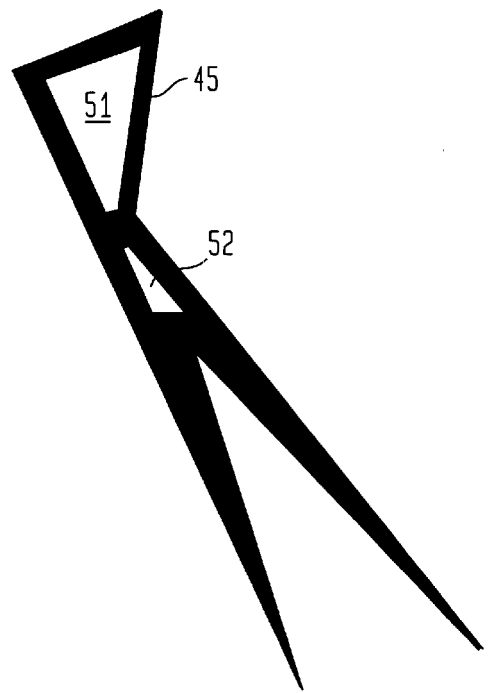
FIG. 4(b) illustrates the same repair outline 45 with severe bias correction applied.

FIG. 4(*a*) again illustrates an example repair 40 as outlined by an operator while FIG. 4(*b*) illustrates the same repair outline 45 with severe bias correction applied. As shown in FIG. 4(*b*), due to the angular feature of the shape and the application of bias, what was once one single area 50 to scan (FIG. 4(*a*)) clear has now become two discrete areas 51, 52 (FIG. 4(*b*)). These kind of effects are very difficult to handle computationally, however, become trivial when the method of the invention is applied.

Figure 5A:
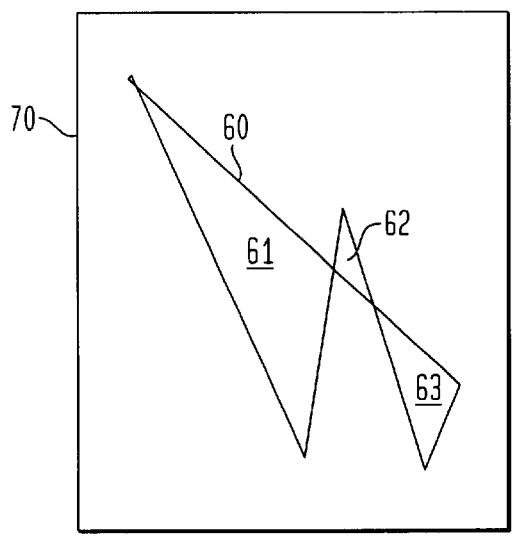
FIGS. 5(a) and 5(b) illustrate detection of the areas to be filled for repair before and after applying bias.
Figure 5B:
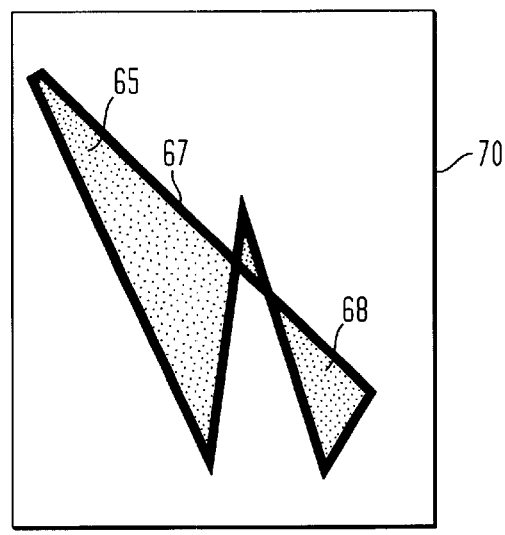

In accordance with another aspect of the invention, the graphical technique implements methods for detecting the distinct interior areas of the repair after bias is applied and filling these areas using standard "Fill" functions, i.e., those functions (callable software modules) provided by operating system API's (application programming interfaces) that are made available to user programming. For example, when programming for a Window's platform, the Window's API provides a number of callable graphic functions including a 'Fill' function which is a particular function giving similar results to the 'Fill' routines available in common graphical 'Paint' programs such as Adobe Photoshop and Windows Paint. Preferably, these areas to be filled are detected automatically by the repair tool during manufacturing without operator intervention. FIGS. 5(*a*) and 5(*b*) illustrate detection of the interior areas of an example repair outline to be filled for repair before and after applying bias. In FIG. 5(*a*), the operator has outlined a shape 60 surrounded by a bounding rectangle. Note that the example repair outline 60 illustrated FIG. 5(*a*) has three areas 61–63 to be filled, while the example repair outline 65 illustrated FIG. 5(*b*) (after applying bias) has only two areas 67, 68 to be filled. Rather than having an operator click on the interior areas to be filled, the software automatically detects these fill areas which is preferable especially when there are numerous areas to be filled that are very small. With reference to the example repair outline of FIG. 5(*a*), according to the invention, the entire polygon 60 is bounded by a rectangle 70 and the area between the rectangle and the border of the polygon is filled with the same color (e.g., yellow) using standard graphic routines available in many software programming languages. At this point, the actual areas that need to be repaired are the pixels that are not of the line color (e.g., black) and not of the outside fill color (e.g., yellow). Then the rectangular area of the bounding rectangle is scanned line by line and pixel by pixel. As soon as a pixel is found lying in the interior area of the polygonal repair outline it is given another unique color (e.g., red). By proceeding thru the entire shape in this manner, the example repair outline 65 of FIG. 5(*b*) results showing the areas 67, 68 that need to be repaired in red. By coordinating subsequent laser/ion beam tool scanning with pixels colored in the interior areas, a more accurate repair is performed, without the degree of computational errors as in the prior art techniques.

FIG. 6(*a*) depicts the software driven methodology 80 for laser/ion beam bias technique for applying repairs to semiconductor wafers according to the invention while FIG. 6(*b*) graphically depicts the represented method steps involved. As shown in FIG. 6(*a*), a first step 82 involves identifying the defect to repair and enclosing the defect within a shape drawn 102 using the default line thickness (bias). The next step 83 involves graphically adjusting the line thickness (bias) to modify the repair area 104 as required.

At step 84, a determination is made as to whether the area outlined for repair is acceptable. The process will revert back to step 83 for further operator bias adjustment until the area outlined with bias applied is acceptable. Next, at step 85, the outlined polygonal area is surrounded with a bounding rectangle 105, and at step 86, the area 106 between the bounding rectangle 105 and the repair shape 104 is painted with a first color. Then, at step 87, the bounding rectangle is scanned 108 in a predetermined order, e.g., from left to right, and every pixel not filled is set to a second (fill) color 109. Next, at step 88, the bounding rectangle and the first color fill outside of the repair shape is removed. Finally, at step 89, in a predetermined manner, scanning 110 of the filled shape is performed. When a pixel of the fill color is encountered, the laser/ion beam tool shutter is opened to ablate that corresponding region of the wafer mapped to that pixel location. Likewise, when a pixel on the border of the area is encountered, the laser/ion beam shutter is closed. Preferably, a simple technique is performed by the software for mapping pixel coordinates with wafer stage and/or laser beam tool movement. For example, as shown in FIG. 6(*b*), mapping a predetermined GUI screen axis coordinate 120 with an initial repair tool beam location, and providing a conversion between pixel location (pixel width) and wafer stage movement (or laser/ion beam tool movement if the wafer stage is static), the repair is easily performed. For example, a conversion factor of pixel to 2.5 $\mu$m of stage movement would mean that if the first color encountered when scanning left to right in FIG. 6(*b*) is at 10 pixels from the pixel coordinate axis 120, the stage is moved 25 $\mu$m to the left at which time the laser/ion beam will be applied to the wafer.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A method for repairing defects in semiconductor wafers utilizing a repair tool having means for applying energy to obliterate defects at locations on said wafer, said method being a graphical approach implementing a graphical user interfee (GUI) comprising a pixel screen display and comprising the steps of:

a) via said interface, identifying a wafer defect to repair and enclosing said defect within a polygonal repair outline drawn using a default line thickness;

b) graphically adjusting the line thickness to modified the enclosed polygonal repair outline area and generate one or more enclosed areas bounded by said modified polygonal repair outline area;

c) graphically demarcating pixels in said one or more enclosed areas bounded by the modified polygonal repair outline area; and d) scanning said modified polygonal repair outline, and automatically mapping each graphically demarcated pixel location inside said one or more enclosed areas with a location of said means for applying energy to said wafer, and initiating said means for applying energy to said wafer coordinated to said demarcated pixel location for repairing said defect, whereby the identification of said pixel location is accomplished using standard graphical tools with minimal operator intervention.

2. The method for rep defects as claimed in claim 1, further comprising the steps of: graphically drawing a further polygon area bounding said modified polygonal repair outline area.

3. The method for repairing defects as claimed in claim 2, wherein said further polygon is a rectangle.

4. The method for repairing defects as claimed in claim 2, wherein said graphically demarcating step c) further comprises the steps of:

via said GUI, graphically filling an area between said bounded further polygon and outside said modified polygonal repair outline area with a first fill color;

graphically filling said detected one or more areas bounded by the modified polygonal repair outline area with a second fill color, wherein prior to said scanning step, the step of removing the bounding rectangle and the first color fill area.

5. The method for repairing defects as claimed in claim 1, wherein said repair tool is a laser beam repair tool, said applied energy including a short-pulse laser.

6. The method for repairing defects as claimed in claim 1, wherein said repair tool is an ion beam repair tool.

7. The method for repairing defects as claimed in claim 1, wherein said scanning step includes the step of coordinating pixel locations with locations on said wafer where energy is to be applied.

8. A system for repairing defects in semiconductor wafers utilizing a repair tool having means for applying energy to obliterate defects at locations on said wafer, said system being a graphical approach implementing a graphic user interface (GUL) comprising a pixel screen display, said system comprising:

mechanism for identifying a wafer defect to repair via said GUI;

graphical tool enabling an operator to draw a polygonal repair outline to thereby enclose said defect via said GUI, said polygonal repair outline drawn using a default line thickness, said graphical tool further comprising mechanism for adjusting the line thickness for modifying enclosed polygonal repair outline area and generate one or more enclosed areas bounded by said modified polygonal repair outline area;

mechanism for graphically demarcating pixels in said one or more enclosed areas bounded by the modified polygonal repair outline area; and, mechanism for scanning said modified polygonal repair outline, and automatically mapping each graphically demarcated pixel location inside said one or more enclosed areas with a location of said means for applying energy to said wafer, and initiating said means for applying energy to said wafer coordinated to said demarcated pixel location for repairing said defect.

9. The system for repairing defects as claimed in claim 8, wherein said graphical tool further enables an operator to graphically draw a further polygon area bounding said modified polygonal repair outline area.

10. The system for repairing defects as claimed in claim 9, wherein said further polygon is a rectangle.

11. The system for repairing defects as claimed in claim 9, wherein said graphical tool further includes mechanism for filling an area between said bounded further polygon and outside said modified polygonal repair outline area with a first fill color, and filling said detected one or more areas within said interior region of the adjusted polygonal repair outline area with a second fill color, wherein said bounding rectangle and the first color fill area are removed prior to said scanning.

12. The system for repairing defects as claimed in claim 8, wherein said repair tool is a laser beam repair tool, said applied energy including a short-pulse laser.

13. The system for repairing defects as claimed in claim 8, wherein said repair tool is an ion beam repair tool.

14. The system for repairing defects as claimed in claim 8, further comprising a control mechanism for coordinating pixel locations with locations on said wafer where energy is to be applied.

15. A program storage device readable by machine, tangibly embodying a program of instructions executable by the machine to perform method steps for repairing defects in semiconductor wafers utilizing a repair tool having means for applying energy to obliterate defeat at locations on said wafer, said method being a graphical approach implementing a graphical user interface (GUI) comprising a pixel screen display and comprising the steps of:

a) via said interface, identifying a wafer defect to repair and enclosing said defect within a polygonal repair outline drawn using a default line thickness b) graphically adjusting the line thickness to modify the enclosed polygonal repair outline area and generate one or more enclosed areas bounded by said modified polygonal repair outline area;

c) graphically demarcating pixels in said one or more enclosed areas bounded by the modified polygonal repair outline area; and, d) scanning said modified polygonal repair outline, and automatically mapping each graphically demarcated pixel location inside said one or more enclosed areas with a location of said means for applying energy to said wafer, and initiating said means for applying energy to said wafer coordinated to said demarcated pixel location for repairing said defect, whereby said pixel identification is accomplished using standard graphical tools with minimal operator intervention.

16. The program storage device readable by machine as claimed in claim 15, further comprising the steps of: graphically drawing a further polygon area bounding said modified polygonal repair outline area.

17. The program storage device readable by machine as claimed in claim 16, wherein said further polygon is a rectangle.

18. The program storage device readable by machine as claimed in claim 16, further including the steps of:

via said GUI, graphically filling an area between said bounded further polygon and outside said modified polygonal repair outline area with a first fill color;

graphically filling said detected one or more areas within said interior region of the modified polygonal repair outline area with a second fill color, wherein prior to said scanning step, the step of removing the bounding rectangle and the first color fill area.

19. The program storage device readable by machine as claimed in claim 15, wherein said repair tool is a laser beam repair tool, said applied energy including a short-pulse laser.

20. The program storage device readable by machine as claimed in claim 14, wherein said repair tool is an ion beam repair tool.

21. The program storage device readable by machine as claimed in claim 14, wherein said scanning step includes the step of coordinating pixel locations with locations on said wafer where energy is to be applied.

* * * * *